(12) United States Patent
Hamer et al.

(10) Patent No.: US 10,756,298 B2
(45) Date of Patent: Aug. 25, 2020

(54) SOLDER HERMETIC SEALING FOR OLEDS

(71) Applicant: OLEDWorks LLC, Rochester, NY (US)

(72) Inventors: John Hamer, Rochester, NY (US); Scott Stickel, Rochester, NY (US); Timothy Floyd Spencer, Rochester, NY (US)

( * ) Notice: Subject to any disclaimer, the term of this patent is extended or adjusted under 35 U.S.C. 154(b) by 0 days.

(21) Appl. No.: 16/176,347

(22) Filed: Oct. 31, 2018

(65) Prior Publication Data

US 2019/0140209 A1 May 9, 2019

Related U.S. Application Data

(60) Provisional application No. 62/581,253, filed on Nov. 3, 2017.

(51) Int. Cl.
| | |
|---|---|
| *H01L 51/52* | (2006.01) |
| *H01L 23/00* | (2006.01) |
| *B23K 1/00* | (2006.01) |

(52) U.S. Cl.
CPC ........ *H01L 51/5246* (2013.01); *B23K 1/0008* (2013.01); *H01L 24/26* (2013.01); *H01L 24/81* (2013.01); *H01L 51/5203* (2013.01); *H01L 51/525* (2013.01)

(58) Field of Classification Search
CPC . H01L 51/5203; H01L 24/81; H01L 51/5246; H01L 51/525; H01L 24/26
See application file for complete search history.

(56) References Cited

U.S. PATENT DOCUMENTS

| | | | |
|---|---|---|---|
| 3,429,040 A | 2/1969 | Miller | |
| 3,472,640 A | 10/1969 | Stockdale | |
| 3,495,133 A | 2/1970 | Miller | |
| 3,508,209 A | 4/1970 | Agusta et al. | |
| 4,081,901 A | 4/1978 | Miller | |
| 5,385,499 A | 1/1995 | Ogawa et al. | |

(Continued)

FOREIGN PATENT DOCUMENTS

JP   2000223263 A   8/2000

OTHER PUBLICATIONS

F.M. Hosking et al, Soldering of Thin Film-metallizing Soda-Lime Glass Substrates, 1999.

*Primary Examiner* — Caridad Everhart

(57) ABSTRACT

An OLED device comprising a substrate with a top surface; a first electrode covering the top surface of the substrate; a first insulating structure patterned over a portion of the first electrode where the pattern defines an inside area of the first electrode that is completely surrounded by the insulating structure, and an outside area of the first electrode not covered by the insulating structure; at least one organic layer for light emission within the inside area defined by the insulating structure; a second electrode over the at least one organic layer within the inside area defined by the insulating structure and at least partially over the first insulating structure; a cover slip located at least over the second electrode in the inside area defined by the insulating structure; and an electrically conductive solder seal making a hermetic seal between the insulating structure and the cover slip where the solder seal is in electrical contact with the second electrode. The insulating structure is desirably made of glass frit.

20 Claims, 12 Drawing Sheets

(56) References Cited

U.S. PATENT DOCUMENTS

| | | | |
|---|---|---|---|
| 5,825,086 A | 10/1998 | Kimura et al. | |
| 6,614,057 B2 | 9/2003 | Silvernail et al. | |
| 8,518,727 B2 | 8/2013 | Ryu et al. | |
| 9,545,682 B2 | 1/2017 | Sridharan et al. | |
| 2003/0062518 A1* | 4/2003 | Auch | B81B 7/0058 |
| | | | 257/40 |
| 2003/0066311 A1* | 4/2003 | Li | C03C 27/06 |
| | | | 65/43 |
| 2003/0184222 A1* | 10/2003 | Nilsson | H05B 33/04 |
| | | | 313/512 |
| 2007/0170845 A1* | 7/2007 | Choi | H01L 51/5246 |
| | | | 313/504 |
| 2008/0239637 A1* | 10/2008 | Sung | H01L 51/5246 |
| | | | 361/679.02 |
| 2011/0156084 A1* | 6/2011 | Choi | H01L 51/5203 |
| | | | 257/99 |
| 2011/0279027 A1* | 11/2011 | Boerner | H01L 51/5268 |
| | | | 313/504 |
| 2013/0285027 A1* | 10/2013 | Loebl | H01L 51/5076 |
| | | | 257/40 |
| 2013/0285537 A1* | 10/2013 | Chaji | H01L 27/3218 |
| | | | 313/504 |
| 2014/0027791 A1* | 1/2014 | Cho | H01L 33/44 |
| | | | 257/88 |
| 2014/0252317 A1* | 9/2014 | Gupta | H01L 51/5203 |
| | | | 257/40 |
| 2015/0380469 A1* | 12/2015 | Kawato | C23C 14/04 |
| | | | 438/35 |
| 2017/0055348 A1 | 2/2017 | Sherrer | |

* cited by examiner

SOLDER HERMETIC SEALING FOR OLEDS

CROSS REFERENCE TO RELATED APPLICATION

This application claims the benefit of U.S. Provisional Application No. 62/581,253, filed Nov. 3, 2017.

GOVERNMENT INTEREST

This invention was made with Government support under Award DE-SC0017100 by the US Department of Energy. The Government has certain rights in this invention.

BACKGROUND

LED and OLED lighting panels offer many advantages for general lighting purposes. They are efficient in terms of light output for power consumed. They are low voltage which helps avoid potential electrical shocks, less prone to sparking in potentially explosive environments and reduce loads in the supporting electrical system. The spectrum of emitted light can be varied using appropriate internal designs. They produce little or no UV or IR light. They are instant on; that is, they emit light immediately whenever electrical power is supplied. LED light sources are inherently small point sources and in order to serve as a flat general lighting source, many separate LED devices must be ganged together. This raises manufacturing costs and complexity. Uniformity of the light surface must be controlled by appropriate design. LEDs produce some heat and so, heat sinks or other thermal control measures are often employed. Practical LED lighting panels can be made very thin, for example as thin as 3-16 mm, with appropriate system design. OLED light sources are inherently flat area light sources. They offer several advantages over LED lighting panels. They can be made even thinner (for example, less than 1 mm thick) and they produce very little heat under normal operating conditions. However, OLED lifetimes can be an issue. Both LED and OLED lighting panels can be made on flexible or curved substrates even though OLED is preferred for these types of applications. In summary, both LED and OLED lighting panels can be useful as lighting panels. They are both efficient, low voltage, cool to the touch, and are thin. Luminaires (a complete unit with a light source (i.e. a lamp) and a support unit (i.e. a lamp holder) that provides light and illumination) can be designed to utilize flat LED or OLED lighting panels.

Although OLED lighting panels have many desirable properties over LED panels, they currently have significantly higher manufacturing costs. In order to increase the penetration of lighting markets and make OLED lighting more cost-competitive to LED lighting, there is a great need for improved manufacturing processes that will lower overall OLED manufacturing costs.

In general, white light emitting OLED panels have multiple organic layers which are responsible for light emission between two electrodes of opposite charge; all located on a substrate. One of the electrodes must be at least semi-transparent. When power is supplied to the electrodes, light is emitted. Because the organic layers are sensitive to air and water, the OLED must be encapsulated; however, electrical connections to the electrodes must still penetrate through the encapsulation. Even in the simplest OLED structures, at least some layers must be patterned; for example, the two electrodes must never come in contact with each other and so, they must be patterned during manufacture so there is no direct contact. In most cases, organic layers cannot be deposited in or over the sealing region of the encapsulation since organic layers are not sufficiently air and water impermeable. Thus, these layers must be patterned to some degree as well.

Because OLEDs are composed of multiple overlapping layers of different materials on a substrate, each layer must be deposited separately and so, the manufacture of the entire OLED requires a large number of steps to complete the device. The electrode layers, which are typically inorganic (i.e. metals or metal oxides), are typically deposited by sputtering techniques. There are two general methods for depositing the organic OLED layers; vapor deposition vacuum or coating from solution. Each of these methods have advantages and disadvantages. Vapor deposition is based on heating the material(s) to be deposited under high vacuum and directing the resulting vaporized material onto the deposition surface. This creates layers of the materials(s) that are generally free from contamination. The organic materials must be thermally stable at their vaporization temperature. However, this method is wasteful in terms of the amount of material actually deposited which leads to higher costs since the OLED materials can be very expensive. Moreover, the rate of material deposition can be relatively slow, leading to long manufacturing times. Finally, the high vacuum equipment required for this method is complex, difficult to maintain and expensive.

For sputtering or vacuum deposition, shadow masks can be used if patterning is necessary. However, the use of shadow masking can be problematic. The masks are thin with fine features and so are expensive to prepare. Moreover, build-up of vaporized material on the masks can be problematic and cleaning them is difficult and time consuming. The useful lifetime of the masks is also limited. Moreover, changing of shadow masks from one step to another can create extraneous particles which can lead to contamination and problems with layer uniformity and shorting during later steps.

Solution coating is based on using OLED materials either in liquid form (i.e. polymers) or soluble in a solvent. The liquid is coated uniformly over the surface and then solidified by solvent removal or other processes. This method has low material waste, the layer can be deposited relatively quickly and the equipment required is relatively simple, but it is very prone to contamination. This leads to variability in terms of efficiency, uniformity and lifetime. Patterning can be accomplished via methods such as ink-jet or screen printing if necessary.

No matter what kind of deposition method is used, it is very desirable to have an in-line production machine where a raw substrate is completely converted to a finished OLED in order to minimize costs. However, because it is necessary to deposit multiple layers, some of which may be patterned, there will generally be many stations along the manufacturing line, each dedicated to a specific step or group of steps. This leads to a complicated equipment line and high capital costs.

One way to minimize costs and decrease complexity of the equipment is to use a "roll-to-roll" system. In a "roll-to-roll" system, a flexible substrate is mounted on a roll on one end of the equipment, then is unrolled and passed through, as a continuous web, the various processing stations to add the OLED layers, and the finished OLED is then rolled up on the end of the equipment. This would require the use of a flexible substrate that would be stable to the various processing steps and be air and water impermeable (since it would be part of the final encapsulation). However, it avoids the complexity of trying to transport a rigid substrate (which necessarily would be in separate, non-continuous sections) throughout many stations. Hybrid systems using individual rigid substrates temporarily mounted on a flexible moving web are known.

For at least these reasons, it would be desirable to develop an in-line OLED manufacturing process which avoids or minimizes the number of masking steps when using vapor deposition or sputtering methods to form the layers, preferably in a roll-to-roll process. Not only would the production equipment be less complex, easier to maintain and have lower capital costs, elimination of shadow masks would lead to still lower costs as well as avoiding mask cleaning. However, even partial elimination of the number of steps requiring shadow masking would still be very advantageous for manufacturing OLEDs. This would apply to both "roll-to-roll" processes as well as non-continuous processes using rigid substrates.

As mentioned previously, the OLED needs to be encapsulated by air- and moisture-proof materials. This can be problematic in a "roll-to-roll" process where a completely finished and fully encapsulated OLED panel is the end product of the production line. This is because while the raw substrate is a continuous roll, the OLED panel is not and will have a finite length. This means that at some point in the overall process, it will be necessary to cut the substrate and its overlying layers perpendicular to the length of the continuous web. This will create side edges of the layers which must be encapsulated. Thus, in such processes, the unfinished OLED web is cut before encapsulation and then encapsulated in a later process. This adds complexity and cost back into the manufacturing process. For this reason, it would desirable to allow for an encapsulation process directly on the continuous OLED web where when the OLEDs are cut into individual sections, the side edges of the various layers are not revealed and remain encapsulated.

It is well known to use solder as a hermetic solder seal for electronic packages in order to protect them from air and water infiltration. A hermetic seal or closure is complete, waterproof and airtight. Generally speaking, a solder seal should be substantially inorganic and not contain significant amounts of organic materials. It should be thermally mobile and is not cured by radiation or curing agents.

There are generally two types of solder used for hermetic sealing. The first type of solder is a low melting alloy of metals, which when melted, can flow between different components and fill up the space between them, thus forming a seal. Often, the exact composition of the solder can be manipulated to improve its properties for the application. The second type is glass frit bonding where glass solders are used to join glasses to other glasses, ceramics, metals, semiconductors, mica, and other materials. Two types of glass solders are used: vitreous, and devitrifying. Vitreous solders retain their amorphous structure during solidifying whereas devitrifying solders undergo partial crystallization during solidifying. Low temperature glass solders are known.

For example, U.S. Pat. No. 3,472,640 describes locally heating a long strip of glass frit solder to make a seal between two glass plates. U.S. Pat. Nos. 3,508,209, 3,429,040, 3,495,133 and 4,081,901 all describe the use of a glass barrier layer to control the spreading/wetting of solder along a conductive electrode. U.S. Pat. No. 5,385,499 describes encapsulation using a pattern of glass frit in a photoresin, followed by heating to remove organics. U.S. Pat. No. 5,825,086 describes putting a metal layer on a top ceramic sealing plate in order to improve solder wetting between a bottom glass plate and the top ceramic plate. U.S. Pat. No. 6,531,663 describes the use of a solder stop (inorganic particles in a weak glass matrix) over a conductive layer to control solder wetting. U.S. Pat. No. 6,614,057 describes side encapsulation using two barrier layers; the outer can be solder, the inner epoxy resin. U.S. Pat. No. 8,518,727 describes side encapsulation with two barrier layers, the outer can be glass frit, the inner UV curable resin. U.S. Pat. No. 9,545,682 describes side encapsulation between glass plates using glass frit solder. There may be an outer dam of glass. US20170055348 describes the use of a wick stop to control solder wetting on a conductive layer. The wick stop is non-wetting and can be an insulating material such as glass. JP2000-223263 describes the use of ultrasonic welding for hermetic sealing of OLEDs. F. M. Hosking et al, "Soldering of Thin Film-metallizing Soda-Lime Glass Substrates', 1999 discusses methods for sealing glass plates with solder in solar cells.

SUMMARY

An OLED device comprising: a substrate with a top surface; a first electrode covering the top surface of the substrate; a first insulating structure patterned over a portion of the first electrode where the pattern defines an inside area of the first electrode that is completely surrounded by the insulating structure, and an outside area of the first electrode not covered by the insulating structure; at least one organic layer for light emission within the inside area defined by the insulating structure; a second electrode over the at least one organic layer within the inside area defined by the insulating structure and at least partially over the first insulating structure; a cover slip located at least over the second electrode in the inside area defined by the insulating structure; and an electrically conductive solder seal making a hermetic seal between the insulating structure and the cover slip where the solder seal is in electrical contact with the second electrode.

Desirably, the insulating structure comprises glass frit, the height of the first insulating structure is in the range of 25-500 μm high and the width of the first insulating layer is in the range of 3-6 mm wide. Glass frit structures can be deposited using screen-printing.

Desirably, the cover slip and first insulating structure are no more than 300 μm apart and the cover slip is located over no more than 75% of the width of the insulating structure.

In some embodiments, there can be an additional second insulating structure patterned over a portion of the first electrode and is located on the opposite side of the first insulating structure from the enclosed area, where the second electrode is located over the at least one organic layer within the inside area defined by the insulating structure, over the first insulating structure and at least partially over the second insulating structure, where the cover slip is located over the second electrode in the inside area defined by the insulating structure and over the first insulating structure; and where the electrically conductive solder seal makes a hermetic seal between the second insulating structure and the cover slip where the solder seal is in electrical contact with the second electrode. There can be desiccant located between the first and second insulating structures.

A method for making the OLED devices described above comprising the steps of: covering the top surface of a substrate with a first electrode; depositing a first insulating structure patterned over a portion of the first electrode where the pattern defines an inside area of the first electrode that is completely surrounded by the insulating structure, and an outside area of first electrode not covered by the insulating structure; depositing at least one organic layer for light emission within the inside area defined by the insulating structure; depositing a second electrode over the at least one organic layer and at least partially over the first insulating structure; placing a cover slip over the second electrode in the inside area defined by the insulating area and the first insulating structure; and making an electrically conductive hermetic solder seal between the first insulating structure and the cover slip where the solder seal is in electrical contact with the second electrode.

When making the OLED devices with a hermetic solder seal, the organic layer(s) can be removed from the insulating structure due to the heat applied during the soldering process (desirably by ultrasonic soldering), or prior to formation of the solder seal by localized thermal heating or sublimation by laser. In processes where vapor deposition is used to form the organic layers, shadow masking can be used to prevent deposition of the organic layer(s) over at least part of the insulating structure. It can be desirable to treat the region of the solder seal with materials that promote adhesion of the solder to the surface prior to formation of the solder seal.

The OLED device can be prepared with reduced unlit space around the perimeter of the device resulting in an increase in the total amount of light available per device size. The OLED lighting panel also has electrical contacts outside the encapsulation that surround the device, which allows for more uniform emission as well as flexibility in terms of panel usage. In particular, external electrical contact can be readily made through electrically conductive solder seal to the second electrode of the OLED and separately to the first electrode which extends under the insulating structure. The OLED device can be manufactured with reduced cost and complexity.

DETAILED DESCRIPTION

For the purposes of this disclosure, the terms "surround", "enclose" and "enclosure" in respect to the insulating structure are used in the two-dimensional sense (e.g. like a fence surrounds an area), and not in the three-dimensional sense (e.g. a structure that surrounds and also covers the area). They can be used interchangeably. The terms "over" or "above" mean that the structure involved is located above another structure on the side opposite from the substrate. Unless otherwise noted, "over" should be interpreted as either that the two structures may be in direct contact or there may be intermediate layers between them.

Figure 1A:
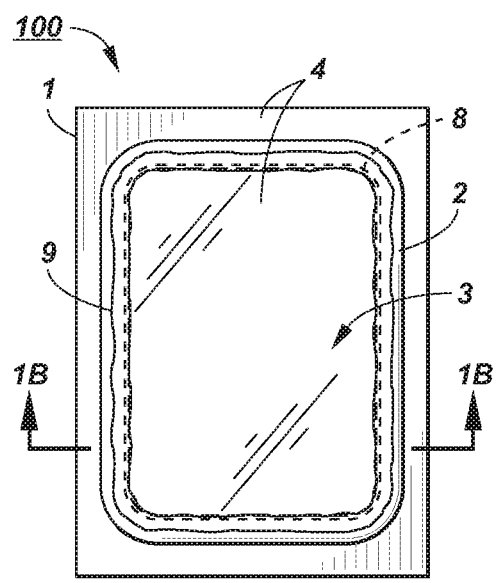
FIG. 1A shows an overhead view an OLED device 100 according to the invention.

FIG. 1A shows an overhead view an OLED device 100 according to the invention. 1 is the substrate whose top surface is covered by a first electrode 4. 2 is the insulating structure which is patterned to surround or enclose an inside area 3 where the first electrode is exposed and where the surrounded or enclosed area 3 is smaller in all directions than the substrate 1. First electrode 4 is also exposed in an outside area of the insulating structure. In this context, the outside area is on the other side of the insulating structure from the inside area and the first electrode is continuous under the insulating structure from the inside area to the outside area. Not shown in this view are organic layer(s) 5, second electrode 6, an optional protection layer 7, cover slip 8 and solder seal 9.

Figure 1B:
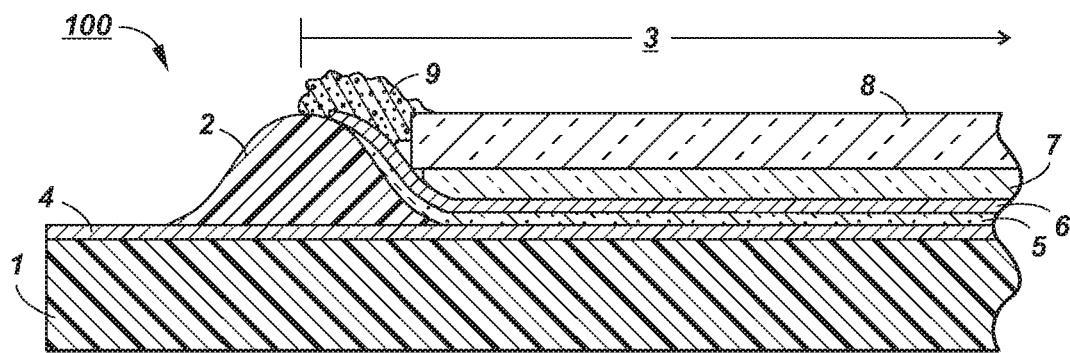
FIG. 1B shows a cross-section of the OLED device 100 along line 1B-1B in FIG. 1A.

FIG. 1B shows a portion of the cross-section along line 1B-1B as indicated in FIG. 1A. As in FIG. 1A, 1 is the substrate and 2 is the insulating structure which is patterned to surround an area 3. 4 is the first electrode which extends across the entire top surface of the substrate 1 and underlies the first insulating structure 2 on both sides. 5 is the organic layer(s) for OLED emission. 6 is the second electrode which overlies the organic layer(s) 5 and partially overlaps the insulating structure 2. 7 is an optional protective layer to prevent damage to the second electrode during fitting of the cover slip 8 within the enclosed area 3. 9 is the solder seal which, in combination with the substrate 1, insulating structure 2 and the cover slip 8, completes the encapsulation of the OLED.

Figure 2A:
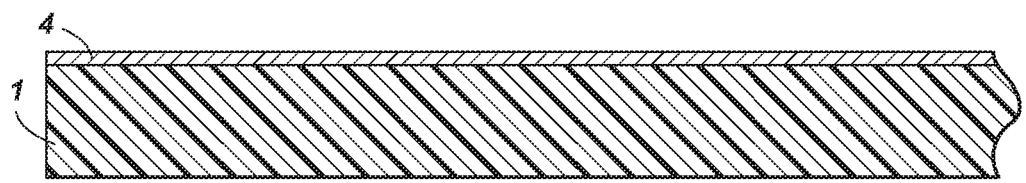
FIGS. 2A-2E shows a sequence of manufacturing steps suitable for manufacturing one embodiment of OLED device 100.
Figure 2B:
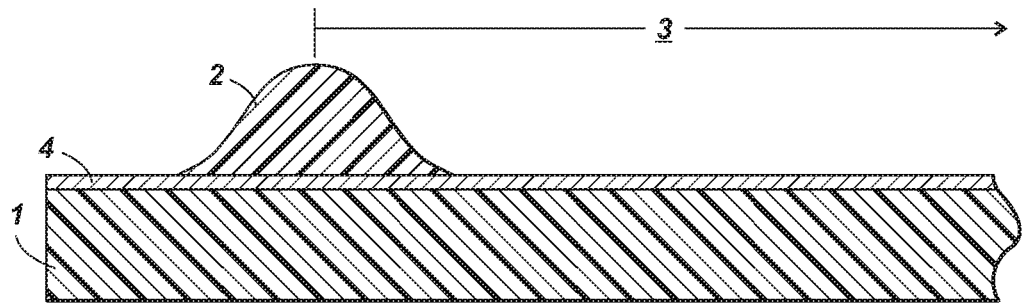
Figure 2C:
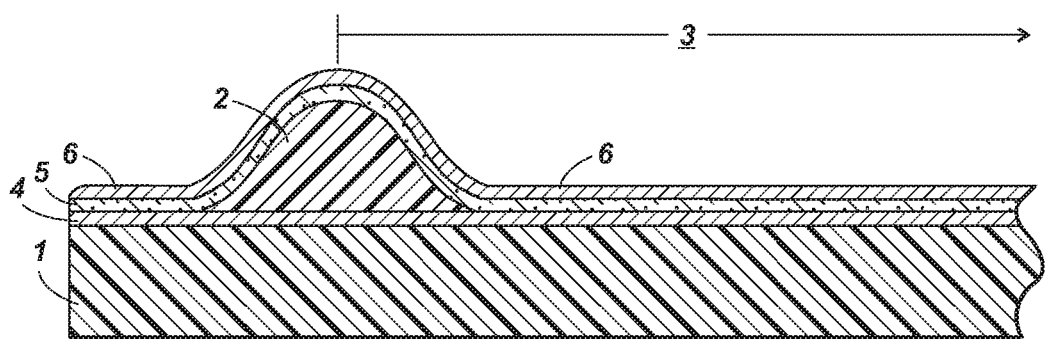
Figure 2D:
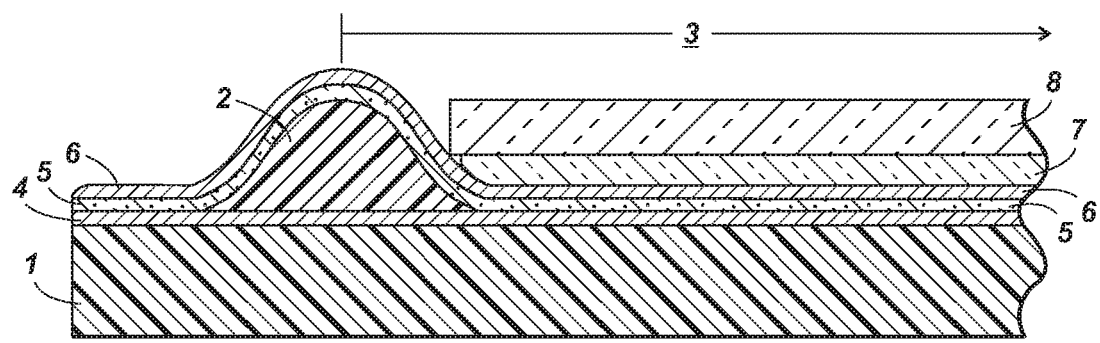
Figure 2E:
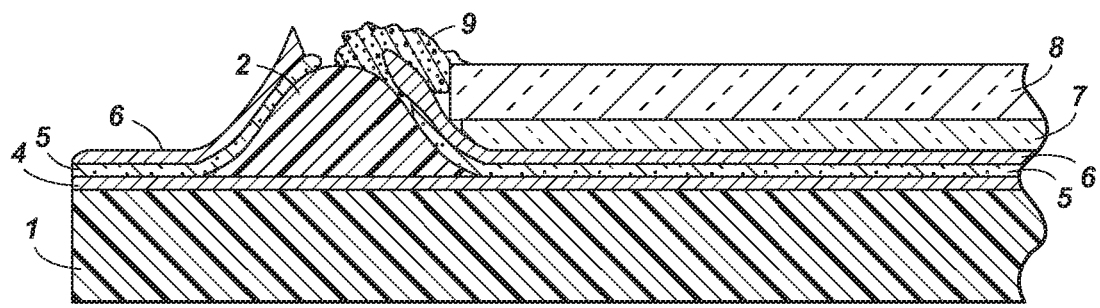

FIGS. 2A-2E show the sequence of preparing one embodiment of the OLED device 100. The first step in preparing the OLED 100 is shown in FIG. 2A where the first electrode 4 is deposited and completely covers the top surface of the substrate 1. Next, an insulating structure 2 is patterned over the electrode 4 as shown in FIG. 2B. Note that the first electrode 4 is present and exposed on both sides of the insulating structure 2, that is, both inside and outside the surrounded area 3. FIG. 2C shows the next two steps where the organic layer(s) 5 and second electrode 6 are deposited over both the insulating structure 2 and the first electrode 4. FIG. 2D shows where the optional protective layer 7 has been patterned to be over the inside area 3 and at least partially over the insulating structure 2 and then a cover slip 8 is positioned over the organic layer 5, the second electrode 6 and protective layer 7 in the enclosed area 3. Note that at this step (for this embodiment), both the organic layer 5 and the second electrode 6 still lie over the insulating structure 2. FIG. 2E shows where solder seal 9 has been deposited and the organic layer 5 and the second electrode 6 have been removed during the soldering process. Note that the solder seal 9 is in electrical contact with the second electrode 6. This allows for outside electrical contact to be made to the second electrode 6 within the encapsulation (provided by substrate 1, cover slip 8, insulating structure 2 and solder seal 9) via the surface of the solder seal 9. In this example, only that part of the organic layer 5 and second electrode 6 in the vicinity of the solder seal (over the insulating structure 2) are removed. Finally, the parts of the organic layer 5 and the second electrode 6 that are not covered by the cover slip 8 and the solder seal 9 and are outside the encapsulation are removed to expose the first electrode 4 in the outside area and results in the device shown in FIGS. 1A and 1B. This allows outside electrical contact to be made to the first electrode 4 outside of the encapsulation. Note that in no case are the first and second electrodes in electrical contact throughout the process.

Figure 3A:
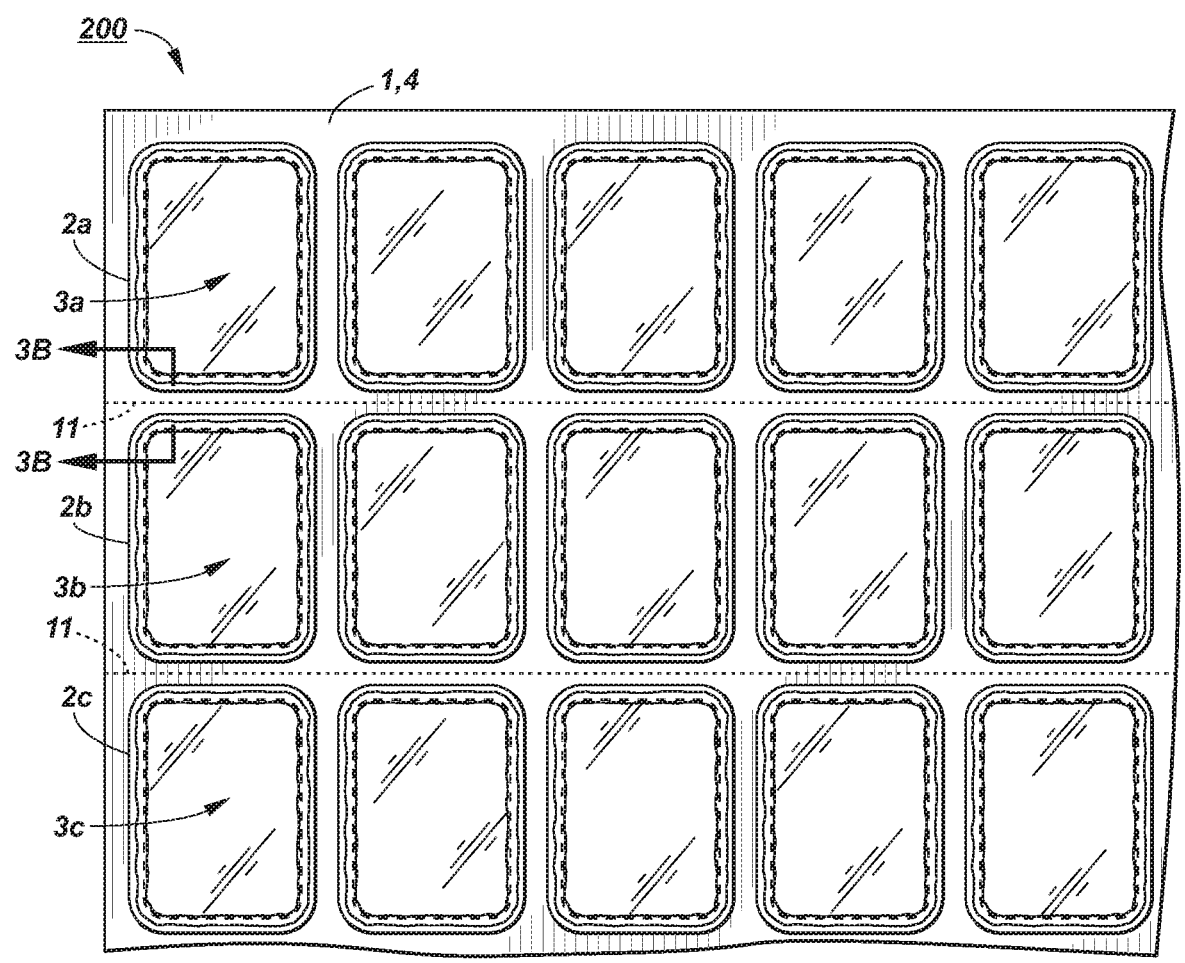
FIG. 3A shows an overhead view of a single substrate with multiple enclosed areas.
Figure 3B:
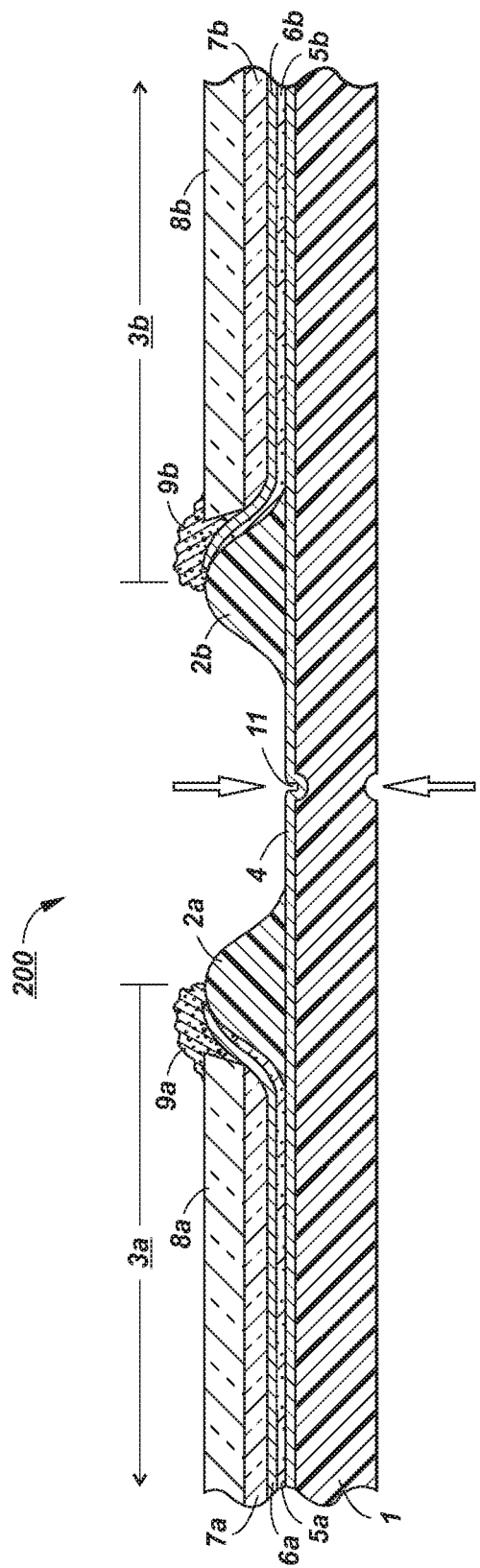
FIG. 3B shows a cross-section along line 3B-3B of FIG. 3A with completed multiple OLEDs along with an indication of where the substrate might be divided into individual and complete OLED panels.

FIG. 3A shows an overhead view of multiple enclosed areas 3a, 3b, 3c, defined by multiple insulating structures 2a 2b, 2c'; all deposited over a first electrode 4 which extends across a single substrate 1. FIG. 3A also shows a scribe line 11. FIG. 3B shows a cross-sectional view along line 3B-3B of FIG. 3A of the completed multiple encapsulated OLEDs on a single substrate. The arrows indicate where the substrate might be separated (for example, by breaking along scribe line 11) so that the OLEDs (i.e. in areas 3a and 3b) can be separated into individual units. Other methods such as sawing, laser or water jet cutting might also be used to separate the multiple encapsulated devices instead of scribing.

One advantage of using an insulating structure with a solder seal for hermetic encapsulation is that it allows for a reduction in the unlit (non-emissive) perimeter around the emission portions of the device. In current OLED devices, extra space is necessary to allow for alignment tolerances of the various steps, including providing the emissive regions and subsequent encapsulation. The insulating structure both defines the emissive region and provides part of the encapsulation so that tolerances can be reduced. Less space along the perimeter is also enabled because the external electrical contacts to the internal electrodes of OLED surround the emissive area. Since the entire perimeter can be used for contact, the contact area can be narrower. Moreover, the two external contacts to the first and second electrodes are spaced apart vertically from each other and so do not need to be spaced laterally from each other along the perimeter, although lateral separation is still desirable for additional protection against shorting.

Some additional details and features of OLED panels that are hermetically sealed with solder will now be described.

While solder sealing would be preferred for OLED lighting panels; that is, OLED panels used for general illumination purposes that feature a uniform area of light emission, OLED displays (i.e. pixelated devices) are also suitable. OLED lighting panels are available in different shapes, sizes and thicknesses on their own substrate. For example, such lighting panels can be rectangular (including rectangles with rounded edges), square, round, oval or triangular. The size used is generally large enough to provide a sufficient amount of light for the design needs. If the design requires additional light than can be provided by a single panel, multiple lighting panels, wired in either series or parallel and with one single controller or with individual controllers, can be used. The panels can emit white light of any color temperature or in some examples such as automotive taillights, can emit colored light.

The substrate can be glass (including flexible glass) or polymeric materials. Generally speaking, it will be flat with a uniform thickness. For bottom emitting OLEDs, the substrate should be transparent. For top emitting OLEDs, the substrate may be opaque or transparent (allowing for two-sided emission) as desired. The top surface of the substrate is that facing the OLED. Since the substrate will be part of the overall encapsulation for the OLED, it should be sufficiently impervious to air and water so that the OLED will have desired lifetime. The substrate can be rigid or flexible. Flexible substrates are preferred for roll-to-roll applications, although this is not necessary. In some cases, the substrate may be mounted temporarily or permanently onto a separate holder or housing during manufacture. The substrate may have various types of subbing layers (i.e. planarization layers, light management layers, etc.) which may be patterned or unpatterned and can be either on the top or bottom surfaces.

There is a first electrode that covers the top surface of the substrate and desirably completely covers the top surface of the substrate. It should be noted that "completely covers the top surface" refers only to that the first electrode is unpatterned and runs continuously and unbroken in all directions over that part of the surface of the substrate that will contain the active areas of the device including the inside and outside areas. There could be some parts of the substrate that are not covered by the transparent first electrode. For example, there can still be a small border of uncovered top surface of the substrate along the edges of the substrate which will not be part of the finished device. In particular, the first electrode will not be patterned and will be continuous in the inside area and under the insulating structure and at least some part of, but not necessarily the entire outside area. The first electrode can be an anode or a cathode and can be transparent, opaque or semi-transparent.

Desirably, the first electrode is a transparent anode and the OLED device is a bottom emitter. The transparent first electrode should transmit as much light as possible, preferably having a transmittance of at least 70% or more desirably at least 80%. However, in some applications (i.e. microcavity devices), the transparent first electrode may only be semi-transparent and have partial reflectivity. While the first transparent electrode may be made of any conductive materials, metal oxides such as ITO or AZO or thin layers of metals such as Ag are preferable. In some cases, there may be an auxiliary electrode to help distribute charge more uniformly across the full plane of the transparent electrode.

The insulating structure should be made of materials that are thermally stable and impervious to air and water penetration. The insulating structure is preferably made of materials that are not electrically conductive. Some examples of suitable insulator materials comprise glass frit, $SiO_2$, $SiN_x$, and common metal oxide insulators like $Al_2O_3$, and $TiO_2$ or mixtures thereof. Glass frit is a particularly desirable insulating material. Although the insulating material should be primarily inorganic, it may contain some amount of organic materials to modify its properties. Usually metal oxide insulators are deposited in thin films using methods such as sputtering, CVD, PECVD, or e-beam evaporation with subsequent patterning by photolithography methods. Such patterned insulator films are common in semiconductor processing. By "structure", it is meant that the insulating material is constructed to have a height or thickness above the first electrode and patterned so that it encloses an area so that it has inside and outside walls.

Glass frit is a ceramic composition such as an aluminosilicate that has been fused in a fusing oven, quenched to form a glass, and granulated. Typically, the glass frit is a paste consisting glass powder, organic binder, inorganic fillers and solvents. Commonly this low melting glass paste is milled into powder (typical grain size <15 µm) and mixed with organic binder forming a printable viscous paste. Inorganic fillers, i.e. cordierite particles (e.g. $Mg_2Al_3$ [$AlSi_5O_{18}$]) or barium silicate, are added to the melted glass paste to influence properties, i.e. lowering the mismatch of thermal expansion coefficients between the glass frit and other components. The solvents are used to adjust the viscosity of the organic binder. Glass frit pastes are commercially available. The choice of the paste depends on various factors, i.e. deposition method, substrate material and process temperatures, etc. Frit compositions are often tailored to provide the appropriate characteristics for its intended usage and purpose. In particular, the composition is used to control the process temperatures, bonding strength and other properties.

Glass frit bonding, also referred to as glass soldering or seal glass bonding, describes a wafer bonding technique with an intermediate glass layer. It is a widely used encapsulation technology. The printed glass frit structures are heated to form compact glass. The heating process is necessary to drive out the solvents and binder. This results in a subsequent particle fusion of the glass powder. The procedural steps of glass frit bonding can be divided into the following steps: deposition of glass paste, burn out and firing (in order to form glass layer), bonding process (with or without additional mechanical pressure), and cooling down.

Screen printing is a commonly used deposition method for glass frits and provides a technique of structuring for the glass frit material. This method has the advantage of material deposition without any additional processes such as photolithography. Screen printing enables the possibility of selective bonding so that only in areas where bonding is required is the glass frit deposited. Under high positioning precision, screen printing can create structures in the range of 190 μm with a minimum spacing of <100 μm are achievable. Other methods for depositing a pattern such as ink-jet or shadow masking during vacuum deposition could be used as well.

Once the deposition of the glass frit structures is complete, it may optionally be fused by thermal treatment. The thermal treatment may be applied to the entire surface as in an oven or only in the localized areas of the glass frit by using a laser or other localized heating techniques. The glass frit may be colored in order to better absorb and localize the thermal treatment. Note that after thermal treatment, the glass frit structures may become, dependent on the wettability of the surface of the transparent first electrode and the composition of the glass frit paste, wider and lower than the originally deposited structures.

There is a patterned structure of insulating material, particularly glass frit, deposited over the first electrode. The insulating structure is deposited in a pattern that surrounds an area (the inside area) of the first electrode. The enclosed area may be any shape; for example, square, rectangular (with or without rounded edges), circular, triangular and the like. The enclosed area will contain the emissive layers of the OLED. It is important that the first electrode extends out from under the insulating structure on the side opposite from the enclosed area, that is, to the outside area. This is so electrical connections can be made to the first electrode outside of the encapsulation that will formed (in part) by the insulating structure. Thus, the enclosed area will be smaller in all directions than surface of the first electrode and substrate on which the enclosed area is located. Likewise, the enclosed area and the area covered by the insulating structure will be smaller in all directions than surface of the transparent first electrode and substrate on which they are located. This allows for the outside electrode connection to the first electrode to be made on any or all sides of the enclosed area. Note that the enclosed area will define the emitting area of the OLED and that the insulating structures, substrate, cover slip and solder seal will form the encapsulation around the enclosed area.

The insulating structure should be deposited so its height (above the deposition surface) is at least 10 μm high, preferable at least 20 μm and desirably in the range of 25-500 μm high. The height should be uniform throughout. The insulating structures should be deposited so they are at least 0.5 mm wide, preferable at least 2.0 mm and desirably in the range of 3-6 mm wide. While it would be desirable that the width of the insulating structures be uniform throughout, in some instances, the width can be wider in some locations than others to provide additional protection against air and water penetration.

Figure 4A:
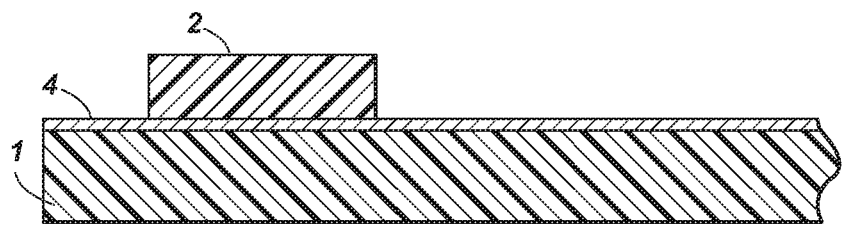
FIGS. 4A-4E show cross-sections for possible designs of the insulating structure.
Figure 4B:
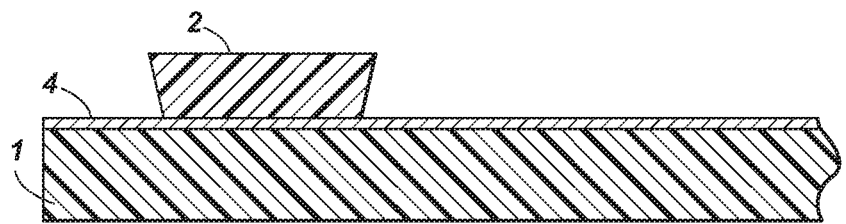
Figure 4C:
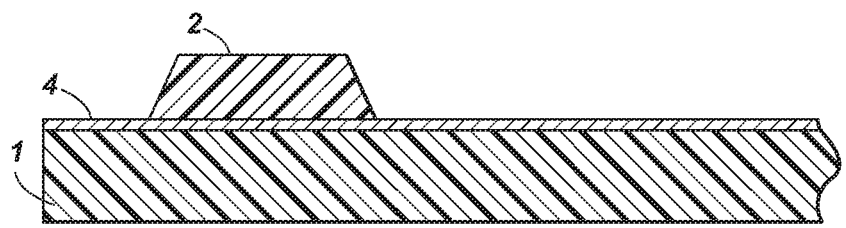
Figure 4D:
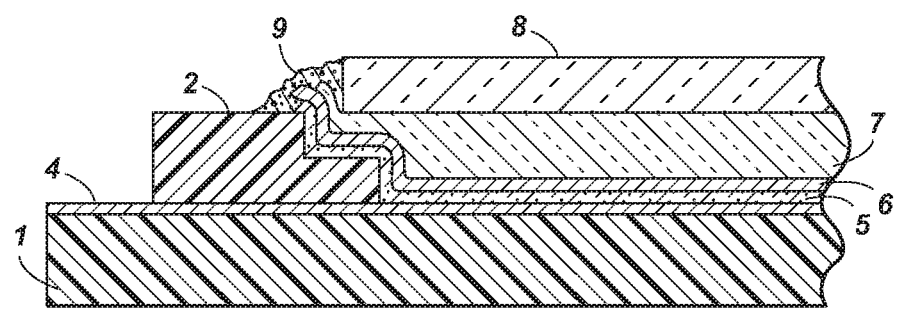
Figure 4E:
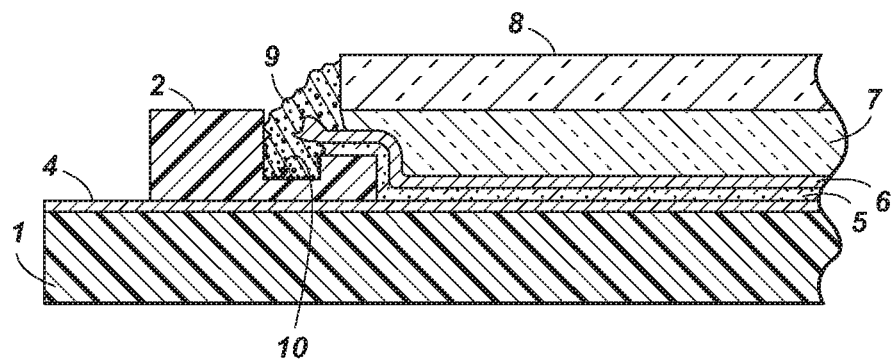

The insulating material can have a structure in the form of a rounded hump as shown in FIG. 1B. However, in some cases, it may be desirable that the insulating structure has a particular design in cross-section. For example, the insulating structure could have vertical (perpendicular to the substrate) sides with a flat top (i.e. FIG. 4A). Alternatively, the sides may be undercut so that they form an acute angle to the substrate (i.e. FIG. 4B) or the sides may form an obtuse angle to the first electrode so that the structure is a right trapezoid in cross-section (i.e. FIG. 4C). While these Figures show both vertical sides having the same orientation to the first electrode, this is not necessary and the vertical sides may be different. For example, the outside wall may be vertical and the inside wall may have an obtuse angle so that the insulating structure is trapezoidal in cross-section (for example, as in FIGS. 8A-8D). The insulating structure may also have rounded corners on the top edge. The insulating structure may have sides with a portion that is vertical and a portion that is sloped as to form a partial ramp. The insulating structure could also have ledges or indentations to improve contact with the cover slip or provides support to the cover slip during the process of forming the solder seal (i.e. FIG. 4D). It is also possible to provide a reservoir 10 in the structure to provide a space for excess solder or to increase its thickness of the seal to add additional protection against air and moisture (i.e. FIG. 4E). Insulating structures of particular cross-sectional design may be prepared using known photolithographic techniques.

Figure 5:
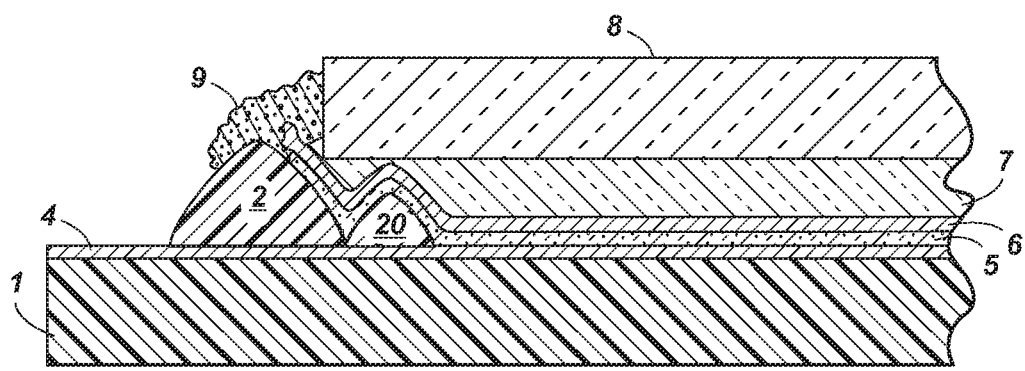
FIGS. 5-7 illustrates various embodiments where there are two adjacent rings of insulating structures.
Figure 6:
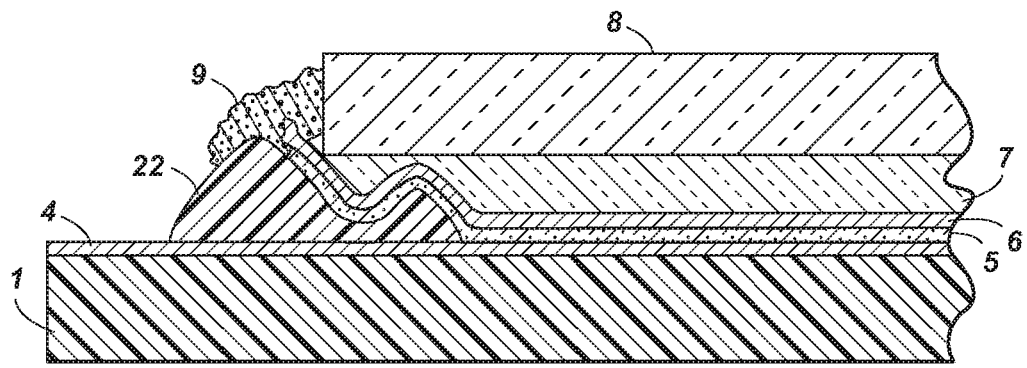
Figure 7:
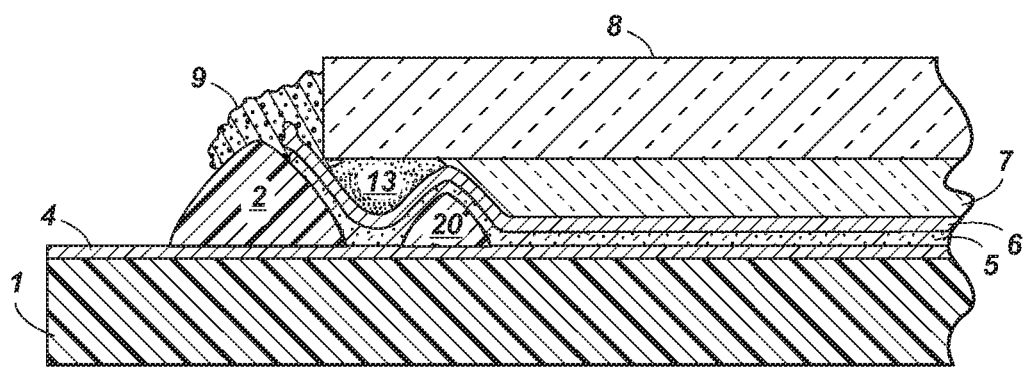

In some cases, it may be desirable that there may be more than one insulating structure that surrounds an area. For example, there can be a first inner ring of insulating structure 20 around the enclosed area and a second outer ring of insulating structure 2 located outside (side opposite of the enclosed area) the inner ring 20 (see FIG. 5). In these cases, the solder seal would be between the top and sides of the second outer insulating structure 2 and the cover slip; the cover slip lying entirely over the inner ring of insulating structure 20. At least the second electrode would also overlie the first inner ring of insulating structure 20 so that the second electrode 6 can still make electrical contact with the solder seal on the second outer insulating structure 2. While these insulating structures can be the same height, it may be that the insulating structure 20 that forms the inner ring is less in height as to provide support for the cover slip. The first inner ring 20 and second outer ring 2 insulating structures may be partially overlapped (FIG. 6). This would create a wider insulating side encapsulation barrier for improved protection. However, the first inner ring 20 and the second outer ring 2 may be spaced apart, leaving a gap between the two rings (FIG. 7). Since this gap is within the encapsulation (provided by the second outer ring of insulating structure 2), the gap could be filled with materials such as a desiccant 13 to provide additional protection. The inner and outer ring of insulating structures may be made of the same or different materials.

The insulating structure may be deposited directly over the top surface of the first electrode. In some cases, the surface of the first electrode may be treated or modified to improve adhesion or wettability to the insulating materials. This treatment may be uniform over the entire surface of the first electrode or may be patterned so that it exists only in the vicinity of the insulating material. There may also be additional structures or patterned layers of material, either permanent or temporary, located to either or both sides of the insulating structure to help control its deposition.

There may be an additional layer or layers of material deposited over the insulating structures after its deposition in order to help adjust or promote its properties. For example, the materials may provide improved adhesion or wettability to the solder or to the second electrode. In some embodiments, the insulating structure may be covered at least in part by at least the organic emissive layers and second electrode and these materials must be in part removed from the insulating structure before or during the solder sealing. Thus, it may be useful to apply materials over the insulating structure to help promote the partial removal of these layers which are part of the OLED. Such adhesion or removal promoting layers may be applied only on the insulating structures or uniformly over the entire surface. They may be applied before or after any thermal treatment used to fuse the insulating structures. If the organic layers are to be introduced via solution, it may be necessary to modify the surface of the insulating structures in order to control their wetting characteristics prior to the introduction of the solution.

Organic layers for light-emission will be deposited over at least the enclosed area defined by the insulating structure and will be in contact with the first electrode. The organic layers may also be deposited at least partially over the first insulating structure in some embodiments. There may be more than one layer and some layers may not be light-emissive. Formulations and layers appropriate for OLED type light emission are well known and can be used as desired. The organic layers may be deposited by any known method including vapor deposition, solution coating, ink-jet techniques, spraying and the like. The organic layers may be patterned so that they are deposited only within the enclosed area but not over the insulating structures, within the enclosed area and at least partially over the insulating structure or (most desirably) deposited without patterning over the entire substrate surface including the enclosed area, the insulating structures and the first electrode that lies on the opposite side of the insulating structure from the enclosed area.

Over the organic layers, there is a second electrode. It may be an anode or a cathode; preferably a cathode. The second electrode may be transparent or opaque, preferably opaque. If transparent, it is desirably composed of conductive transparent metal oxides such as ITO or thin layers of metals such as Ag. If opaque, it is desirably composed of a thicker layer of metal or metal alloy such as Al, Ag, Mg/Al, Mg/Ag and the like. The second electrode may be deposited by any known technique. The second electrode should overlie the organic layers within the enclosed areas and at least part of the insulating structure since it is necessary to make electrical contact with the solder seal at the joint between the top and/or sides of the insulating structure and the cover slip. The second electrode may be patterned so that it is deposited only within the enclosed area and at least partially over the insulating structure or (most desirably) deposited without patterning over the entire substrate surface including the enclosed area, the insulating structure and the first electrode that lies on the opposite side of the insulating structure from the enclosed area.

Over the second electrode, there may optionally be a protective organic layer, protective inorganic layer, or combination of both. This is to prevent damage to the second electrode and underlying organic layers from applying the cover slip and forming the solder seal. For example, this protective layer can be made from polymeric material such as epoxy. It could also be a pressure sensitive adhesive layer in order to help secure the cover slip to the remainder of the device. It should be at least 10 μm thick, preferably at least 25 μm thick and most desirably in the range of 50-100 μm thick. The protective layer should be non-electrically conductive. The protective layer may be patterned to lie only over the enclosed area, over the enclosed area and at least part of the insulating structure or over the entire surface of the substrate including the enclosed area, the insulating structure and the first electrode that lies outside the insulating structure.

A pre-cut or pre-formed cover slip or sheet is used to provide encapsulation of the top surface of the active OLED materials located within the enclosed area defined by the insulating structure. It should be impervious to air and water. It may be made of glass, metal or polymeric materials. It may be rigid or flexible. It may be transparent or opaque. It should be at least 25 μm thick, preferably at least 50 μm thick and most desirably in the range of 100-1500 μm thick. The side edges of the cover slip can be specially designed to have better fit to the insulating structures or promote a better solder seal. The cover slip and insulating structures may be designed together so that they fit or lock partially in place before the solder seal is formed. Moreover, the cover slip may be pretreated to promote better adhesion or wettability to the solder.

Figure 8A:
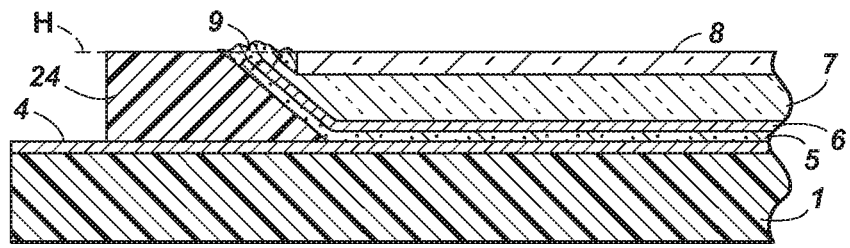
FIGS. 8A-8D illustrates various relative relationships between the cover slip and the insulating structure.
Figure 8B:
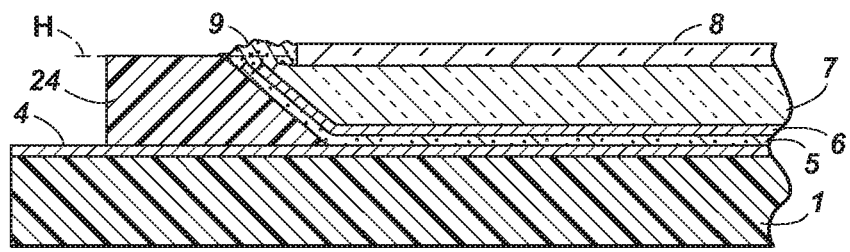
Figure 8C:
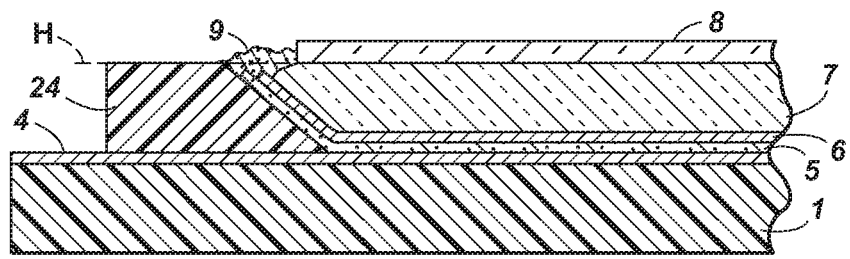

The size and shape of the cover slip should be such that it fits over the entire enclosed area and almost to or in contact with the top and/or sides of the insulating structures. It may be that the height of the insulating structure is such that the top of the insulating structure is at the same level of the top surface of the cover slip. For example, FIG. 8A shows an embodiment where the top of the cover seal 8 is at the same level (as indicated by line H) as the top of a flat topped trapezoidal insulating structure 24. In this case, the side edge of the cover slip 8 will abut or be close to the side wall of the insulating structure 24. FIG. 8B illustrates another embodiment where the height of the insulating structure 24 is such that its top is at a level between the top and bottom surfaces of the cover slip 8 as indicated by line H. In this case, the bottom of the side edge of the cover slip 8 will abut or be close to the side wall of the insulating structure 24. FIG. 8C shows an embodiment where the top of the insulating structure 24 is such that it at the same level as the bottom surface of the cover slip 8 as indicated by line H. In this case, the side edge of the cover slip 8 will abut or be very close to the top of the insulating structure 24.

Figure 8D:
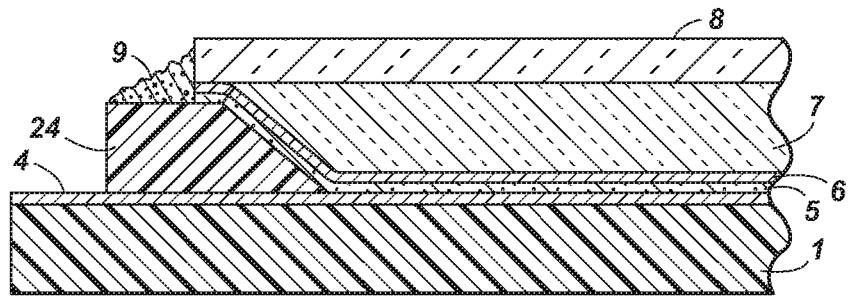

However, whenever the cover slip 8 overlaps the insulating structure 24 as shown in FIG. 8D, the cover slip should not completely overlap the insulating structure since this would make removal of any layers overlying the insulating structures during the formation of the solder seal very difficult. Ideally, the cover slip should not extend over more than 75% of the width of the insulating structure when the cover slip is located directly over part of the insulating structure.

In all of these situations, there will be at least the second electrode over that part of the insulating structure where the cover slip is in close contact. Desirably, the cover slip should be no more than 10 μm apart from the surface of the insulating structure, preferably no more than 300 μm apart and most desirably no more than 50-150 μm apart.

Once the cover slip is placed in position over the enclosed area and in some embodiments, at least partially over the insulating structure, an electrically conductive solder seal is formed to provide complete hermetic encapsulation. Generally, solder is a fusible metal alloy used to create a permanent bond between two surfaces. Usually, solder must be melted in order to adhere to and connect the pieces together, so a suitable alloy for use as solder will have a lower melting point than the pieces it is intended to join. Whenever possible, the solder should also be resistant to oxidative and corrosive effects that would degrade the joint over time. Moreover, solder that is intended for use in making electrical connections between electronic components, as in this case, should have favorable electrical characteristics. Prior to application of the solder seal, the area of contact between the insulating structure (which is at least partly covered by the second electrode) and the cover slip has open spaces and so, the OLED materials within the enclosed area are not hermetically sealed. Filling this region with solder by melting the solder and allowing it to flow into and fill the cracks and crevices and then re-solidifying the solder then provides a hermetic seal. During this process, the solder will come into contact with the second electrode and so provides an electrical connection to the second electrode from outside the encapsulation. Note that the solder seal is separated from the first electrode by a non-conductive insulating structure and so, there will be no shorting between the two electrodes. In may be necessary to treat the cover slip and insulating structure at least in the vicinity of the seal with materials that promote the adhesion and wetting properties of the solder.

Note that in this invention, the cover slip and the insulating structure are not directly bonded together to form the encapsulation, but rather the insulating structure forms a side encapsulation barrier where the final encapsulation is formed between the top and/or sides of the insulating structure and the edges of a cover slip by a solder seal.

The chosen solder must be electrically conductive and impervious to moisture and air. Typically, the solder seal is metallic. Its melting temperature must be low enough to avoid damage to the OLED materials within the enclosed areas. However, in some embodiments, the surface of the insulating structure will be at least partially, if not fully, covered with layers of organic protective materials, organic OLED layers or other organic materials. Such organic layers are typically permeable to both moisture and air and cannot be exposed outside the encapsulation. Thus, in the process of forming the solder seal, these layers must be removed either prior to the formation of the seal or during the process itself. Since the solder seal is electrically conductive and in contact with the second electrode, it can be used as a contact pad to supply electrical power or signals from an external source to the second electrode within the emissive area of the OLED.

Any organic layers over the insulating structure in the vicinity where the solder seal will be formed may be partially removed in the vicinity of the junction of the insulating structure and cover slip to expose the surface of the insulating structure before the application of the solder. For example, this could be accomplished by localized thermal heating and sublimation by laser. Note that at least part of the second electrode layer must remain accessible to the solder so that the thermal treatment should not entirely remove the second electrode. Alternatively, the materials over the insulating structures could be removed (or at least disrupted) by the heat of the melted solder during the process. Desirably, the heat or ultrasonic energy of the soldering process is sufficient to cause sublimation of all or part of the organic materials out of the vicinity of the solder seal. It should be noted that while it is desirable to remove as much of the organic material(s) in the vicinity of the solder seal as possible, some may remain so long as the layer structure is sufficiently disrupted so that no edges are exposed outside the solder seal. At least part of the second electrode should remain so that it may be necessary to adjust the temperature or time of the soldering process in order to maximize the removal of the organic(s) while minimizing any removal of the second electrode. Thus, the temperature or energy provided should not substantially remove the second electrode, which has a much higher sublimation temperature than the organics, although the layer structure of the second electrode may be disrupted and distorted. In any case, the solder seal (after formation) should extend continuously from at least part of the insulating structure to the cover slip on all sides without allowing the exposure of any organic layers to the outside.

Solder formulations are well known and are often selected or compounded to provide the desired properties. In this case, the solder must be electrically conductive, impermeable to air and water, have a melting point and process temperature that minimizes damage to the OLED within the enclosed area, and be able to flow and wet the insulating structure and cover slip surfaces in order to make a good seal. Moreover, the thermal expansion coefficient of the solder should be matched to the materials being joined, or if the materials are dissimilar, chosen to fall in between the coefficients of expansion of the materials. The solder should not contain components that can sublime or migrate into the enclosed area and negatively impact the OLED. While metal solders are preferred, other types of solders such as glass solders are useful, provided they can provide sufficient electrical conductivity; for example, through inclusion of conductive particles. Even sealants such as those based on silicon or epoxies could be used as a solder if they provide sufficient electrical conductivity and impermeability.

In order to form a good hermetic seal, it is necessary for the solder to make good contact with both the insulating structure and cover slip. The solder should have sufficient wettability towards both these surfaces so that a solid joint is formed without bubbles, cracks or voids. This may require the use of a flux or prior treatment of the region by materials that promote adhesion of the solder to the surface. Moreover, for flexible substrates, the solder should be sufficiently ductile or flexible not to crack when the substrate is bent.

The method of delivering the solder to the joint between the insulating structure and cover slip is not critical. The solder may come in the form of a wire, sheet or discrete small particles. It may come preformed in the shape of the enclosed area. It may be delivered to the joint as a melt or applied as a solid which is then melted by localized heating. In some instances, it may advantageous to perform the soldering operation in a nitrogen or inert gas atmosphere.

Among examples of local heating treatments for melting the solder would be by heating with a laser or in particular, ultrasonic soldering. Ultrasonic soldering is a flux-less soldering process that uses ultrasonic energy, without the need for chemicals to solder materials, such as glass, ceramics, and composites, hard to solder metals and other sensitive components which cannot be soldered using conventional means. Ultrasonic soldering is a distinctly different process than ultrasonic welding. Ultrasonic welding uses ultrasonic energy to join parts without adding any kind of filler material while ordinary soldering uses external heating to melt filler metal materials, namely solders, to form a joint. Ultrasonic soldering uses either ultrasonically coupled heated solder iron tips (0.5-10 mm) or ultrasonically coupled solder baths. In these devices, piezoelectric crystals are used to generate high frequency (20-60 kHz) acoustic waves in molten solder layers or batch, to mechanically disrupt oxides that form on the molten solder surfaces. The tips for ultrasonic soldering irons are also coupled to a heating element while the piezoelectric crystal is thermally isolated, so as to not degrade the piezoelectric element. Ultrasonic soldering iron tips can heat (up to 450° C.) while mechanically oscillating at 20-60 kHz. This soldering tip can melt solder filler metals as acoustic vibrations are induced in the molten solder pool. The vibration and cavitation in the molten solder then permits solders to wet and adhere to adjacent surfaces. The acoustic energy created by the solder tip or ultrasonic solder apparatus works via cavitation of the molten solder which mechanically disrupts oxide layers on the solder layers themselves and on metal surfaces being joined. In the cases of soldering direct to glasses and ceramics, it is desirable for ultrasonic soldering filler metals to be modified with active elements such as In, Ti, Hf, Zr and rare earth elements (Ce, La, and Lu). Solders when alloyed with these elements are called "active solders" since they directly act on the glass/ceramic surfaces to create a bond. In applications where the area of the solder joint is a small area or band, ultrasonic soldering using 1-10 mm tips can be very effective since the volume of molten metal is small and can effectively be agitated by the 1-10 mm soldering iron tips. In larger surface bonding applications, heated ultrasonic tips can be used to spread and wet active solders on large surfaces such as insulating structure and the cover slip. Another advantage of ultrasonic soldering is that the active elements often allow processing at lower soldering iron temperatures and substrate temperatures, thus allowing soldering to be done closer to the active area without damage to the OLED materials in the active area.

When ultrasonic soldering, it may be advantageous to apply ultrasound to the surfaces of both the cover slip and the insulating structure in order to assure good bonding. Shaping of the soldering iron tip to conform to the particular geometry of the region between the cover slip and insulating structure (for example, as shown in FIG. 8A-8D) and tipping the iron can be used to accomplish this objective.

The external appearance or shape of the completed solder seal will depend on the relative spatial relationship between the insulating structure and the cover slip. In embodiments using flat topped insulator structures (i.e. FIGS. 8D and 9B) where the cover slip partially overlies the insulating structure, it is desirable that the solder seal have a fillet weld like geometry. Fillet welding refers to the process of joining two pieces of metal together when they are at an angle to each other. The weld is aesthetically triangular in shape and may have a concave, flat or convex surface.

Figure 9A:
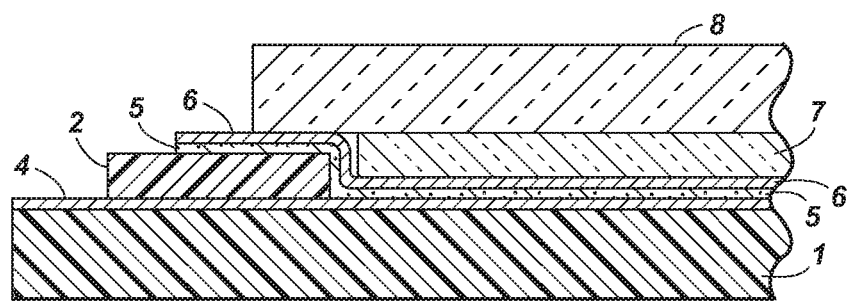
FIG. 9A shows a cross-section illustrating the positioning of a covet sheet over a flat-topped insulating structure before solder seal formation.
Figure 9B:
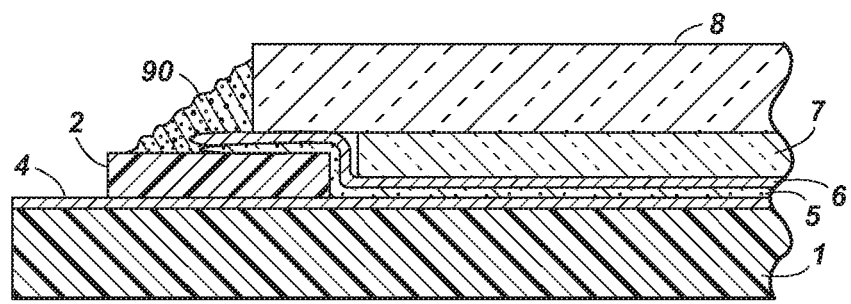
FIG. 9B shows the same cross-section as FIG. 9A after formation of a solder seal with fillet geometry.

For example, FIG. 9A shows a cover slip 8 located over the top of a flat-topped insulating structure 2 which is partially covered with organic layer(s) 5, second electrode 6 and optional protective layer 7. As shown in FIG. 9B, the formation of a fillet solder seal 90 disrupts and partially removes the organic layer(s) 5, second electrode 6 and optional protective layer 7.

Figure 10A:
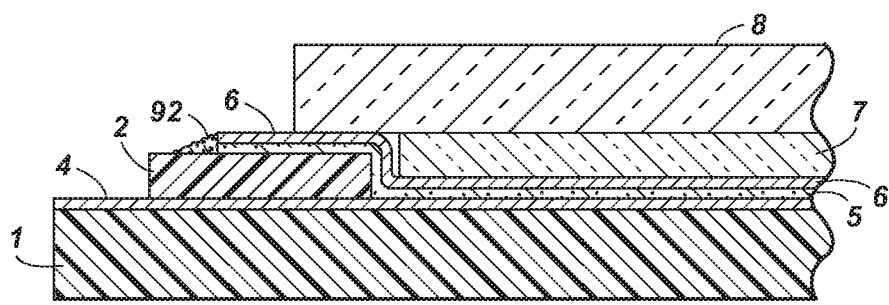
FIGS. 10A and 10B shows cross-sections for a two-step solder sealing process.
Figure 10B:
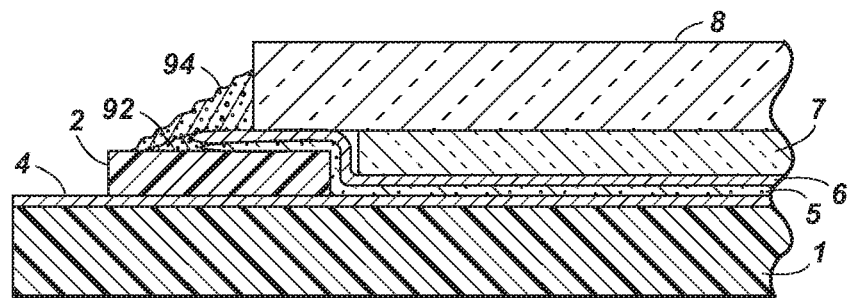

In another embodiment, the solder seal could be deposited in two separate steps. In the first step (as shown in FIG. 10A), a small amount of a first type of solder 92 is used to contact the second electrode 6 to form an electrode contact while at least partially removing or disrupting the organic layer(s) 5. This step does not complete the encapsulation alone. In the second step (shown in FIG. 10B), a second application of a second type of solder 94 forms the hermetic seal between the cover slip 8 and the insulator structure 2 and covers the first solder 92. The solder used in the first and second steps may be the same or different.

Once the solder seal is formed, the OLED within the enclosed area is fully encapsulated. At this point, the substrate outside of the enclosed areas can be cut into individual OLED units if necessary (see FIG. 3B). External electrical connections can be made to the first transparent electrode on the outside of the insulating structure and to the second electrode via the solder seal; both of these contact points are outside the encapsulation.

In embodiments where there are remaining layers such as the organic layer(s), second electrode and optional protective layer lying over the first electrode outside encapsulation provided by the solder seal and insulating structure, such layers may be later removed from the surface of the first electrode outside of the encapsulation by any appropriate means such as thermal treatment, solvents or mechanical means such as sticky tape, scrubbing or nitrogen jet. It is also possible that a release layer be coated over the first electrode prior to deposition of the insulating structures in the region opposite from the enclosed area. After the encapsulation is complete, the release layer will enable the removal of any overlying layers in this region by appropriate treatment.

While it is highly desirable to have a continuous process for producing OLED panels using vapor deposition methods without any shadow masks at all, processes requiring as few shadow masks as possible are still desirable. In the processes for manufacturing the OLED panel described above, no shadow masks are required in some embodiments and the OLED organic layers, second electrode and (optional) protective layer can be deposited over both the insulating structure and the first electrode that lies outside the insulating structure. Those layers over the first electrode that lies outside the insulating structure must eventually be removed so that external electrical contact to the first electrode can be made. Those layers that overlie the insulating structure must also be at least partially removed from the insulating structure so that the solder seal can form a full hermetic seal with no exposure of the organic layers. This need for removal of these layers increases the complexity of the process, adds extra steps to the process and is wasteful of organic material.

Figure 11:
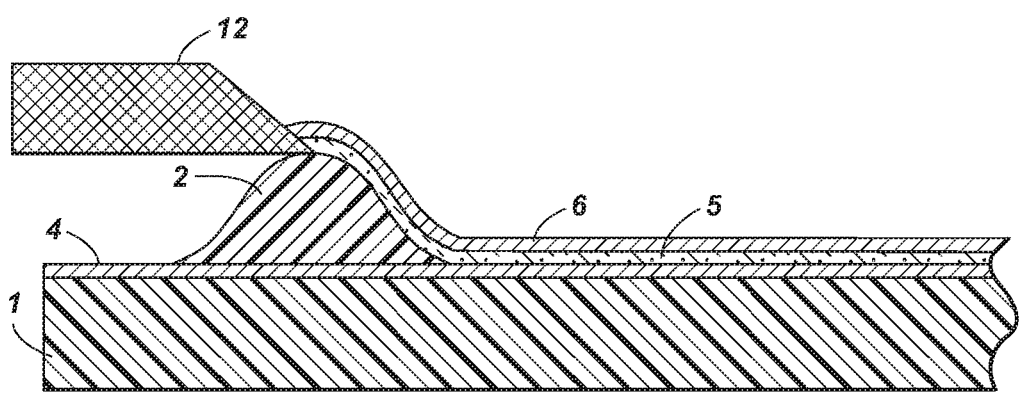
FIG. 11 illustrates the use of a shadow mask during vacuum deposition.

The need for removal of these layers over the first electrode that lies outside the insulating structure and removal of these layers over part of the insulating structure can be avoided by using a single shadow mask during the deposition of these layers. This is illustrated in FIG. 11. The edge of a shadow mask 12 is positioned along the top of the insulating structure 2. Then, when the organic layers 5 and the second electrode 6 are vapor deposited, the shadow mask 12 prevents their deposition over the full width of the insulating structure (leaving some of the insulating structure still covered) or over that part of the first electrode 4 located outside of the insulating structure. The same shadow mask can be used to prevent the deposition of the optional protective layer 7 (not shown) as well. Thus, the same shadow mask can be used for multiple deposition steps. Moreover, the shadow mask 12 will have only a large opening corresponding to the enclosed area plus some portion of the width of the insulating structure and so, has no fine features and will be relatively simple to manufacture, Finally, the exact positioning of the shadow mask along the insulating structure is less critical and so replacement for cleaning and subsequent alignment steps will be simpler. For substrates with multiple enclosed areas/insulating structures, the shadow mask will require multiple corresponding openings. The shadow mask 12 can be located in contact with or a short distance removed from insulating structure 2.

In the above description, reference is made to the accompanying drawings that form a part hereof, and in which are shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. The description of any example embodiments is, therefore, not to be taken in a limiting sense. Although the present invention has been described for the purpose of illustration, it is understood that such detail is solely for that purpose and variations can be made by those skilled in the art without departing from the spirit and scope of the invention.

PARTS LIST

1 Substrate
2, 2a, 2b, 2c, 24 First insulating structure
3, 3a, 3b, 3c Inside area
4 First electrode
5 Organic layer(s)
6 Second electrode
7 Optional protection layer
8 Cover slip
9 Solder seal
10 Reservoir
11 Scribe line
12 Shadow mask
13 Desiccant
20 Inner insulating structure
24 Flat topped insulating structure
90 Filet solder seal
92 First solder for electrical contact
94 Second solder for hermetic seal
100 OLED Device
200 Multiple OLED devices on single substrate

The invention claimed is:

1. An OLED device comprising:
a substrate with a top surface;
a first electrode covering the top surface of the substrate;
a first insulating structure patterned over a portion of the first electrode where the pattern defines an inside area of the first electrode that is completely surrounded by the insulating structure, and an outside area of the first electrode not covered by the insulating structure;
at least one organic layer for light emission within the inside area defined by the insulating structure;
a second electrode over the at least one organic layer within the inside area defined by the insulating structure and at least partially over the first insulating structure;
a cover slip located at least over the second electrode in the inside area defined by the insulating structure; and
an electrically conductive solder seal making a hermetic seal which extends continuously from at least part of the first insulating structure to the cover slip without allowing the exposure of any organic layers to the outside and where the solder seal is in electrical contact with the second electrode.

2. The OLED device of claim 1 where the insulating structure comprises glass frit.

3. The OLED device of claim 1 where the cover slip and first insulating structure are no more than 300 µm apart.

4. The OLED device of claim 1 where the cover slip is located over no more than 75% of the width of the insulating structure.

5. The OLED device of claim 1 where height of the first insulating structure is in the range of 25-500 µm high.

6. The OLED device of claim 1 where the width of the first insulating layer is in the range of 3-6 mm wide.

7. The OLED device of claim 1 where external electrical contact is made through the surface of the solder seal, which is outside of the cover slip, to the second electrode.

8. An OLED device comprising:
a substrate with a top surface;
a first electrode covering the top surface of the substrate;
an outer insulating structure patterned over a portion of the first electrode where the pattern defines an inside area of the first electrode that is completely surrounded by the outer insulating structure, and an outside area of the first electrode not covered by the outer insulating structure;
an inner insulating structure patterned over a portion of the first electrode and is located within the inside area;
at least one organic layer for light emission within the inside area;
a second electrode over the at least one organic layer within the inside area, over the inner insulating structure and at least partially over the outer insulating structure;
a cover slip at least over the second electrode in the inside area, the inner insulating structure, and at least partially over the outer insulating structure; and
an electrically conductive solder seal making a hermetic seal which extends continuously from at least part of the second outer insulating structure to the cover slip without allowing the exposure of any organic layers to the outside and where the solder seal is in electrical contact with the second electrode.

9. The OLED device of claim 8 where both the first and second insulating structures comprise glass frit.

10. The OLED device of claim 9 where there is desiccant located between the first and second insulating structures.

11. A method for making an OLED device comprising the steps of:
covering the top surface of a substrate with a first electrode;
depositing a first insulating structure patterned over a portion of the first electrode where the pattern defines an inside area of the first electrode that is completely surrounded by the insulating structure, and an outside area of first electrode not covered by the insulating structure;
depositing at least one organic layer for light emission within the inside area defined by the insulating structure;
depositing a second electrode over the at least one organic layer and at least partially over the first insulating structure;
placing a cover slip at least over the second electrode in the inside area defined by the first insulating structure; and
making an electrically conductive hermetic solder seal which extends continuously from at least part of the first insulating structure to the cover slip without allowing the exposure of any organic layers to the outside and where the solder seal is in electrical contact with the second electrode.

12. The method of claim 11 where the step of depositing at least one organic layer for light emission comprises:
depositing by vapor deposition at least one organic layer for light emission over the patterned insulating structure and the first electrode using a shadow mask such that the at least one organic layer is deposited only within the inside area defined by the insulating structure.

13. The method of claim 11 comprising the additional step of:
treating the region of the solder seal with materials that promote adhesion of the solder to the surface prior to formation of the solder seal.

14. The method of claim 11 where the step of making the electrically conductive hermetic solder seal uses ultrasonic soldering.

15. The method of claim 11 where the first insulating structure comprises glass frit.

16. The method of claim 15 where the deposition of the patterned first insulating structure is by screen-printing.

17. The method of claim 11 where at least part of the at least one organic layer is removed from the first insulating structure prior to formation of the solder seal.

18. The method of claim 17 where the method of removal of at least part of the at least one organic layer is selected from localized thermal heating and sublimation by laser.

19. The method of claim 11 comprising the additional steps of:
depositing an inner insulating structure patterned over a portion of the first electrode and is located within the inside area;
depositing a second electrode over the least one organic layer, the inner insulating structure, and the first insulating structure;
locating the cover slip at least partially over the first insulating structure as well as over the second electrode and inner insulating structure in the inside area.

20. The method of claim 19 comprising the additional step of:
placing a desiccant between the first and second insulating structures.

* * * * *